(12) United States Patent
Xiao et al.

(10) Patent No.: US 9,202,762 B2
(45) Date of Patent: Dec. 1, 2015

(54) HYBRID INTEGRATED SEMICONDUCTOR TRI-GATE AND SPLIT DUAL-GATE FINFET DEVICES AND METHOD FOR MANUFACTURING

(75) Inventors: DeYuan Xiao, Shanghai (CN); Guo Qing Chen, Boise, ID (US); Roger Lee, Eagle, ID (US)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 272 days.

(21) Appl. No.: 12/986,130

(22) Filed: Jan. 6, 2011
(Under 37 CFR 1.47)

(65) Prior Publication Data

US 2012/0032732 A1 Feb. 9, 2012

(30) Foreign Application Priority Data

Jan. 8, 2010 (CN) .......................... 2010 1 0022579

(51) Int. Cl.
*H01L 21/782* (2006.01)
*H01L 21/84* (2006.01)
(Continued)

(52) U.S. Cl.
CPC .......... *H01L 21/845* (2013.01); *H01L 27/1211* (2013.01); *H01L 29/7855* (2013.01)

(58) Field of Classification Search
CPC ............ H01L 29/66795; H01L 21/845; H01L 27/1211; H01L 27/10879; H01L 29/785; H01L 21/823431; H01L 29/823431
USPC .......... 257/331, 270, 365; 438/157, 283, 481, 438/599
See application file for complete search history.

(56) References Cited

U.S. PATENT DOCUMENTS 4,992,838 A 2/1991 Mori
7,244,666 B2 * 7/2007 Jin ................................ 438/481
(Continued)

FOREIGN PATENT DOCUMENTS

CN 1581431 A 2/2005
CN 101060136 A 10/2007
CN 1753156 A 3/2009

OTHER PUBLICATIONS

Zaman et al., Effects of Hydrogen Annealing Process Conditions on Nano Scale Silicon (011) Fins, 2005, Materials Research Society Symposium Proceedings, 872, J3.1.1-5.*
(Continued)

*Primary Examiner* — Kenneth Parker
*Assistant Examiner* — Young W Kim
(74) *Attorney, Agent, or Firm* — Kilpatrick Townsend and Stockton LLP

(57) ABSTRACT

A method for making an integrated circuit includes at least a tri-gate FinFET and a dual-gate FinFET. The method includes providing a semiconductor on insulator (SOI) substrate. The method also includes implanting impurities into the substrate for adjusting a threshold voltage. The method provides a nitride film overlying a surface region of the substrate and selectively etches the silicon nitride film to form a nitride cap region. The method etches the silicon layer to form a first and a second silicon fin regions. The nitride cap region is maintained on a portion of a surface region of the first silicon fin region. The method includes forming a gate dielectric, depositing a polysilicon film, and planarizing the polysilicon film by chemical mechanical polishing (CMP) using the nitride cap region as a polish stop. The method etches the polysilicon film to form gate electrodes. The method forms elevated source and drain regions.

18 Claims, 12 Drawing Sheets

(51) Int. Cl.
*H01L 27/12* (2006.01)
*H01L 29/78* (2006.01)

(56) References Cited

U.S. PATENT DOCUMENTS

| | | | |
|---|---|---|---|
| 7,525,160 | B2 | 4/2009 | Kavalieros et al. |
| 2003/0139065 | A1 | 7/2003 | Han |
| 2004/0075121 | A1 | 4/2004 | Yu et al. |
| 2005/0077574 | A1 | 4/2005 | Mouli |
| 2006/0068550 | A1 | 3/2006 | Chang et al. |
| 2006/0128131 | A1* | 6/2006 | Chang et al. .................. 438/599 |
| 2007/0132009 | A1* | 6/2007 | Takeuchi et al. .............. 257/321 |
| 2008/0194091 | A1 | 8/2008 | Lin et al. |
| 2009/0017589 | A1 | 1/2009 | Ban et al. |
| 2009/0152634 | A1 | 6/2009 | Grant |
| 2009/0325350 | A1* | 12/2009 | Radosavljevic et al. ...... 438/163 |
| 2013/0102116 | A1 | 4/2013 | Xiao et al. |

OTHER PUBLICATIONS

Al-Shareef et al., Device performance of in situ steam generated gate dielectric nitrided by remote plasma nitridation, 2001, vol. 78, 3875-3877.*

Al-Shareef et al. (Applied Physics Letters 78, 3875-3877, 2001).*

Zaman et al. (Mater. Res. Symp. Proc. 872, J3.1.1-5, 2005).*

* cited by examiner

HYBRID INTEGRATED SEMICONDUCTOR TRI-GATE AND SPLIT DUAL-GATE FINFET DEVICES AND METHOD FOR MANUFACTURING

CROSS-REFERENCES TO RELATED APPLICATIONS

This application claims priority to Chinese Patent Application No. 201010022579.3, filed Jan. 8, 2010, which is commonly assigned and incorporated by reference herein for all purposes.

BACKGROUND OF THE INVENTION

Embodiments of the present invention relate to integrated circuits and the processing for the manufacture of semiconductor devices. More particularly, embodiments of the present invention provide a method and device for providing a dual-gate FinFET and a tri-gate FinFET on the same SOI substrate. Merely by way of example, the invention has been applied to high current drive I/O devices and low leakage core logic devices in integrated circuits. But it would be recognized that the invention has a much broader range of applicability. For example, the invention can be applied to integrated circuits requiring devices having different threshold voltages and performance requirements.

As semiconductor device feature size continues to scale down to nanometer regime and approaches scaling limits for CMOS processes and technology, at such reduced gate lengths, conventional CMOS devices have difficulty in maintaining high drive current (Ion) with low leakage (Ioff) and threshold stability. To fabricate devices beyond current scaling limits, integrated circuit manufacturers are rigorously exploring alternative gate stack materials, band engineering methods, and alternative transistor structures simultaneously.

CMOS designs below 100 nm are severely constrained by lateral short channel effect (SCE) and vertical gate insulator tunneling leakage current. One of the approaches to circumvent the gate tunneling restriction is to change the device structure in such a way that MOSFET gate length can be scaled down further even with thicker oxide. A promising candidate for channel length range of 5-30 nm is the so-called FinFET built on an SOI substrate.

In low power circuit applications, there is often a need to have transistors having different threshold voltages on the same chip. For example, certain circuits need low threshold voltage for higher drive current and can tolerate higher leakage current, whereas other circuits may demand low leakage current which requires a high threshold current. In conventional technologies, it is necessary to fabricate transistors having different gate oxide thicknesses and channel dopings to obtain multiple different threshold voltages.

For small geometry MOSFET devices, silicon-on-insulator (SOI) technology has been proposed as an alternative to bulk CMOS devices. SOI MOSFET devices are fabricated in a thin film of silicon layer overlying an insulating layer. Such devices often offer reduced parasitic effect than conventional bulk devices. Further improvement can be obtained in a FinFET in which a gate electrode is formed over the sides and the top of a channel region of an MOSFET. The channel region, along with a source region and a drain region are formed in a silicon fin structure located over an insulator. In a FinFET, the gate electrode has a better control of the channel region. In some examples, a FinFET device includes a gate electrode that is formed over three sides of a channel region. It is referred to as a Tri-gate FinFET or single-gate FinFET. In other examples, a FinFET device can have two independent gate electrodes. It is referred to as a dual-gate FinFET. In conventional technology, Tri-gate and dual-gate FinFETs are fabricated separately for different applications. These and other limitations are described throughout the present specification and more particularly below.

From the above, it is seen that an improved technique for processing semiconductor devices is desired.

BRIEF SUMMARY OF THE INVENTION

Embodiments of the present invention relate to integrated circuits and the processing for the manufacture of semiconductor devices. More particularly, embodiments of the present invention provide a method and device for providing a dual-gate FinFET and a tri-gate FinFET on the same SOI substrate. Merely by way of example, the invention has been applied to high current drive I/O devices and low leakage core logic devices in integrated circuits. But it would be recognized that the invention has a much broader range of applicability. For example, the invention can be applied to integrated circuits requiring devices having different threshold voltages and performance requirements.

A specific embodiment of the invention provides a method for making an integrated circuit including at least a tri-gate FinFET and a dual-gate FinFET. The method includes providing a semiconductor on insulator (SOI) substrate. The SOI substrate includes a semiconductor layer overlying an insulator layer. The semiconductor layer includes a surface region. In an embodiment, the SOI substrate includes a substrate, an oxide layer overlying the substrate, and a silicon layer overlying the oxide layer. In another embodiment, the SOI substrate includes a substrate, an insulator layer overlying the substrate, and a silicon-germanium layer overlying the insulator layer. The method also includes implanting impurities into the silicon layer for adjusting a threshold voltage. The method provides a nitride film overlying the surface region, and selectively etches the silicon nitride film to form a nitride cap region. The method also includes etching the silicon layer to form a first and second silicon fin regions. The nitride cap region is maintained on a portion of a surface region of the first silicon fin region. In a specific embodiment, the first silicon fin region is characterized by a width of about 5-50 nm and a height of about 5-100 nm. In an embodiment, the second silicon fin region is characterized by a width of about 5-50 nm and a height of about 5-100 nm. In a specific embodiment, the first and second silicon fin regions are annealed in an $H_2$ ambient at a temperature range of approximately 800-1000° C.

In a specific embodiment, the method forms a gate dielectric, deposits a polysilicon layer, and planarizes the polysilicon film by chemical mechanical polishing (CMP) using the nitride cap region as a polish stop. The method selectively etches the polysilicon film to form a first gate electrode and a second gate electrode for the first silicon fin region. The first and second gate electrodes are on opposite sides of the first silicon fin region. The method selectively etches the polysilicon film to form a third gate electrode. The third gate electrode is adjacent to and overlying a portion of the second silicon fin region. In an embodiment, the method includes forming spacers and implanting impurities to form source and drain regions. The method also forms elevated source and drain regions and performs backend processing.

In a specific embodiment, the method selectively etches the polysilicon film. In an embodiment, the method forms elevated source and drain regions by forming a SiGe layer on the source and drain regions using selective epitaxial growth at a temperature of about 700-800° C. in an ambient of $SiH_2Cl_2+HCl+GeH_4$. In an embodiment, the SiGe layer has a thickness ranging from about 100 nm to about 500 nm. In a specific embodiment, the backend process includes depositing interlayer dielectrics, forming contact regions, and forming interconnects. In some embodiments, the interconnects can include copper interconnect lines. In a specific embodiment, the dielectrics comprise low-k dielectrics. In an embodiment, the contact regions include tungsten plugs.

An alternative embodiment of the invention provides an integrated circuit apparatus. The apparatus includes a silicon-on-insulator (SOI) substrate, which includes a silicon layer overlying an insulator layer. The apparatus includes a first silicon fin region formed in the silicon layer. The first silicon fin region includes a first source region, a first drain region, and a first channel region. The first channel region further includes a first, second, and third surface regions. The apparatus includes a second silicon fin region formed in the silicon layer. The second silicon fin region includes a second source region, a second drain region, and a second channel region. The second channel region further includes a fourth surface region, a fifth surface region and a sixth surface region. The apparatus includes a gate dielectric layer. The gate dielectric layer is formed on the first, second, and third surface regions of the first silicon fin region. The gate dielectric layer is also formed on the first and second surface regions of the second silicon fin region. The apparatus includes a dual-gate FinFET, which includes the drain, source and channel regions in the second silicon fin region. The dual-gate FinFET further includes a first gate electrode and a second gate electrode. The first gate electrode overlies the gate dielectric on the first surface region of the second silicon fin region. The second gate electrode overlies the gate dielectric on the second surface region of the second silicon fin region. The apparatus also includes a tri-gate FinFET, which includes the drain, source and channel regions in the first silicon fin region. The tri-gate FinFET further includes a third gate electrode overlying the gate dielectric on the first, second, and third surface regions of the first silicon fin region.

In a specific embodiment of the present invention, the dual-gate FinFET further includes a silicon nitride layer overlying the sixth surface region in the second silicon fin region. The nitride layer is configured to electrically insulate the first gate electrode from the second gate electrode. In some embodiments, the source and drain regions of the dual-gate FinFET are elevated. In some embodiments, the source and drain regions of the tri-gate FinFET are elevated. In a specific embodiment, the silicon layer is characterized by a thickness of about 5-100 nm. In an embodiment, the channel region of the dual-gate FinFET is characterized by a width of about 5-50 nm and a length of about 5-30 nm. In an embodiment, the channel region of the tri-gate FinFET is characterized by a width of about 5-50 nm and a length of about 5-30 nm. In a specific embodiment, the dual-gate FinFET is operated in a weak inversion region.

In yet an alternative embodiment, the invention provides a method of operating an integrated circuit. The method includes providing an SOI substrate, and providing a first circuit region and a second circuit region in the SOI substrate. The method adds a tri-gate FinFET in the first circuit region. The tri-gate FinFET includes a drain electrode, a source electrode, and a gate electrode. The method adds a dual-gate FinFET in the second circuit region. The dual-gate FinFET includes a drain electrode, a source electrode, a first gate electrode and a second gate electrode. The method also includes applying a first and a second bias voltages to the drain electrode and source electrode of the tri-gate FinFET, respectively, and receiving a first signal at the gate electrode of the tri-gate FinFET. The method includes applying a third bias voltage and fourth bias voltage to the drain electrode and the source electrode of the dual-gate FinFET, respectively, and receiving a second signal and a third signal at the first and second gate electrodes of the tri-gate FinFET, respectively. In a specific embodiment, the tri-gate FinFET includes a channel region which is surrounded by a gate electrode on three sides. In an embodiment, the dual-gate FinFET includes a channel region sandwiched between the first and second gate electrodes, and the first gate electrode is insulated from the second gate electrode by a nitride region. In a specific embodiment, the first circuit region is an I/O region, and the second circuit region is a core logic region. In an embodiment, the third signal is a dynamic signal. In yet another embodiment, the dual-gate FinFET is operated in a weak inversion region.

Embodiment of the present invention can provide many benefits over conventional techniques. A specific embodiment of the present invention provides a method for forming a single tri-gate FinFET and split Dual-gate FinFET devices on the same semiconductor chip. In some embodiments, Tri-gate FETs (single gate FinFETs) will be implemented in the first I/O device with the biggest power supply VD to maximize current drive capability. In some embodiments, split Dual-gate FinFETs will be implemented in the core device and/or a secondary I/O devices where Ioff can be minimized. In some embodiments, the two gates in the split Dual-gate FinFETs can be electrically and logically independently biased to control the fin channel. Device characteristics such as threshold voltage and sub-threshold swing (SS) can be modulated dynamically for increased circuit design flexibility. A specific embodiment of the invention provides a method that can be implemented using conventional process technology and equipment. Depending upon the embodiment, one or more of these benefits may be achieved. These and other benefits are described throughout the present specification and more particularly below.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE INVENTION

Embodiments of the present invention relate to integrated circuits and the processing are provided for the manufacture of semiconductor devices. More particularly, embodiments of the present invention provide a method and device for providing a dual-gate FinFET and a tri-gate FinFET on the same SOI substrate. Merely by way of example, the invention has been applied to high current drive I/O devices and low leakage core logic devices in integrated circuits. But it would be recognized that the invention has a much broader range of applicability. For example, the invention can be applied to integrated circuits requiring devices having different threshold voltages and performance requirements.

Depending upon the embodiment, the present invention includes various features, which may be used. These features include the following:

1. Simultaneously fabrication Tri-gate and dual-gate FinFETs on a same substrate;
2. Fabrication method using conventional process and equipment; and
3. A method for using Tri-gate FinFETs in I/O circuits and dual-gate FinFETs in core logic circuits.

As shown, the above features may be included in one or more of the embodiments to follow. These features are merely examples, which should not unduly limit the scope of the claims herein. One of ordinary skill in the art would recognize many variations, modifications, and alternatives.

Figure 1A:
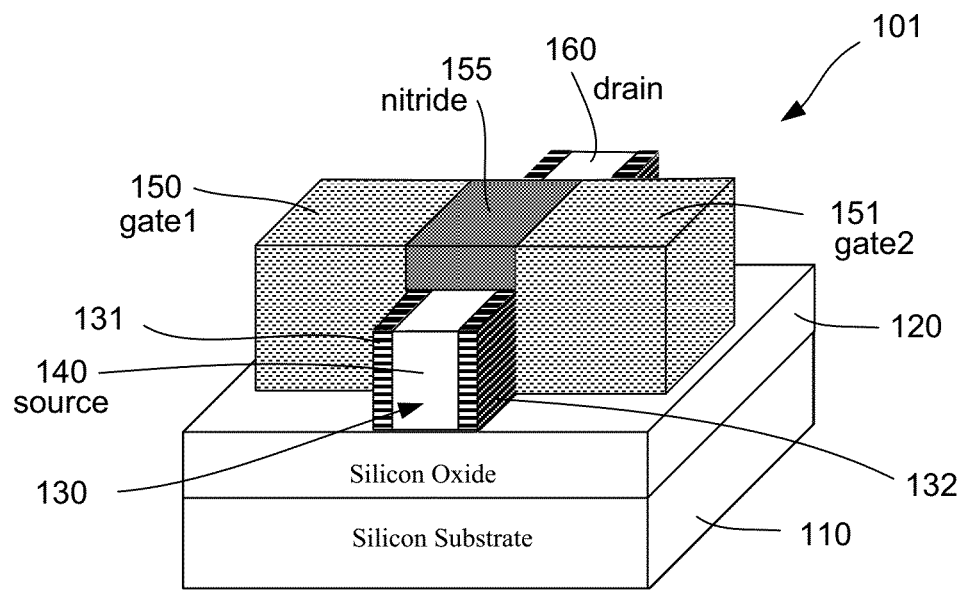
FIG. 1A is a simplified cross-sectional view diagram of a split Dual-gate FinFET device according to an embodiment of the present invention.

FIG. 1A is a simplified diagram of a dual-gate FinFET device 101 according to an embodiment of the present invention. This diagram is merely an example, which should not unduly limit the scope of the claims herein. One of ordinary skill in the art would recognize other variations, modifications, and alternatives. As shown, dual-gate FinFET device 101 includes substrate 110, and an insulator layer 120 overlying the substrate. In an embodiment, the insulator layer is a silicon oxide layer and the substrate comprises silicon. The dual-gate FinFET 101 also includes a silicon fin region 130 on the insulator layer 120. In a specific embodiment, the silicon fin region is a rectangular block of silicon characterized by a thickness of about 5-100 nm and a width of about 5-50 nm. In other embodiment, the silicon fin region may include silicon germanium. In other embodiments, the dimension of the silicon fin region may be varied for different applications. Of course, there can be other variations, modifications, and alternatives.

The dual-gate FinFET 101 also includes gate oxide regions 131 and 132 on the sides of the silicon fin region. A gate region 150 is positioned to one side of the silicon fin region and is separated from the silicon fin region by a gate oxide 131. A gate region 151 is positioned to another side of the silicon fin region and is separated from the silicon fin region by a gate oxide 132. An end portion of the silicon fin is a source region 140, and another end portion of the silicon fin is a drain region 160. As shown, gate region 150, gate oxide 131 and the silicon fin region 130 are associated with an MOS transistor, which also includes source region 140 and drain region 160. The channel length is determined by the width of gate region 150. In an embodiment, channel length is about 5-30 nm. Of course, there can be other variations, modifications, and alternatives.

As also shown in FIG. 1A, a second MOS transistor is formed with gate region 151, gate oxide 132, silicon fin 130, source region 140 and drain region 160. In an embodiment, the silicon fin has a thickness of about 5-100 nm. Each MOS transistor has a front gate that controls the conductivity of its channel and has a back gate that controls the body potential of the transistor. As shown, nitride region 155 lies above the silicon fin. The nitride region separates gate region 150 from gate region 151. Therefore, gate 150 and gate 151 can be independently biased to control current flow in the fin channel, and allow device characteristics such as threshold voltage and sub-threshold swing (SS) to be adjusted for specific applications. In some embodiments, the dual gates can be used to dynamically modulate the characteristics of the FinFET, i.e., a control signal derived from a part of the circuit can be applied to one of the dual gates to modulate behavior of the dual-gate FinFET. As an example, the dual-gate FinFET can be utilized in core logic circuits applications which demand low leakage current.

Figure 1B:
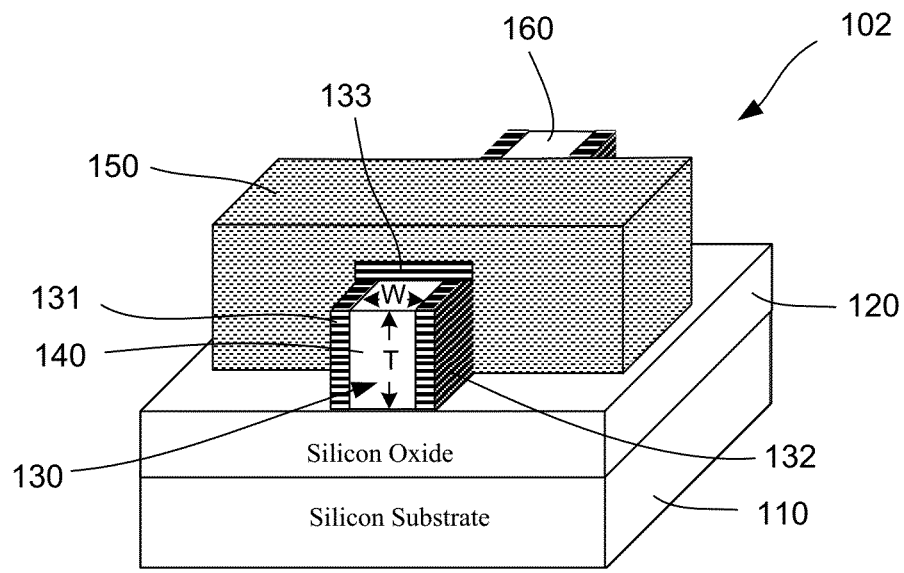
FIG. 1B is a simplified cross-sectional view diagram of a Tri-gate FinFET device according to an embodiment of the present invention.

FIG. 1B is a simplified diagram of a single-gate or tri-gate FinFET device 102 according to an embodiment of the present invention. This diagram is merely an example, which should not unduly limit the scope of the claims herein. One of ordinary skill in the art would recognize other variations, modifications, and alternatives. As shown in FIG. 1B, single-gate FinFET device 102 includes similar device elements as in dual-gate FinFET 101, e.g., substrate 110, insulator layer 120, silicon fin 130, gate oxide regions 131 and 132, source region 140, drain region 160, and gate region 150. However, FinFET 102 has a single continuous gate region 150 which is positioned on three sides of silicon fin 130 and is separated from the silicon fin by gate oxide regions 131, 132, and 133. Therefore an MOS transistor is formed with gate region 150 modulating a bias voltage on three sides of the fin channel. The single-gate or tri-gate FinFET is capable of providing large current drive, because the wide effective channel width provided by the three sides of the silicon fin. Such large current drive is advantageous in, for example, I/O circuit applications.

In an embodiment of the present invention, a dual-gate FinFET device and a single-gate FinFET device are provided on the same substrate. In some embodiment, an integrated circuit chip includes single-gate FinFETs in I/O circuits and dual-gate FinFETs in core logic circuits. Of course, one of ordinary skill in the art would recognize other variations, modifications, and alternatives.

Figure 2:
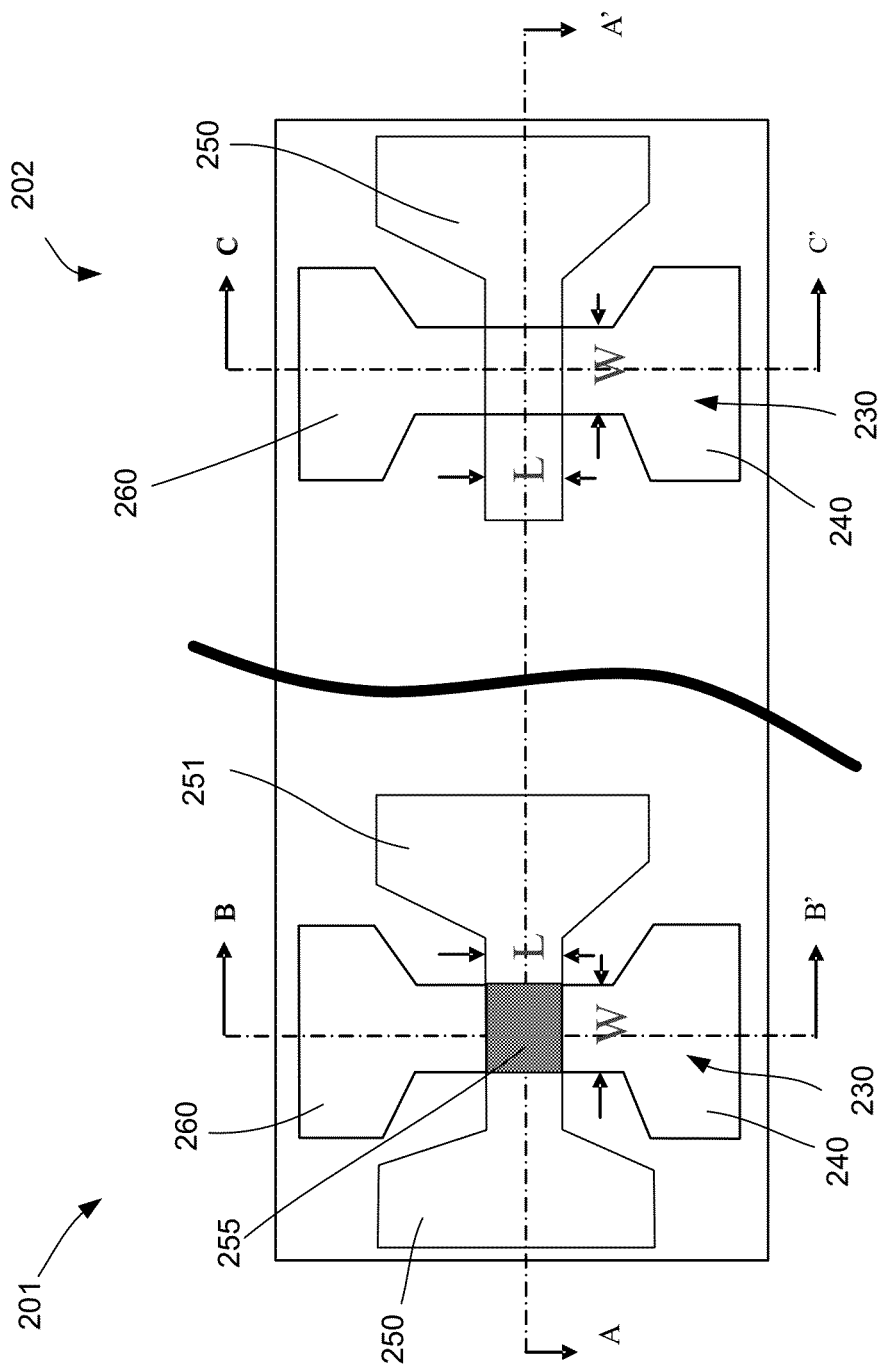
FIG. 2 is a simplified top view layout diagram for a Dual-gate FinFET device and a Tri-gate FinFET device according to an embodiment of the present invention.

FIG. 2 is a simplified top view layout diagram for a dual-gate FinFET 201 device and a tri-gate FinFET 202 device according to an embodiment of the present invention. This diagram is merely an example, which should not unduly limit the scope of the claims herein. One of ordinary skill in the art would recognize other variations, modifications, and alternatives. As shown, dual-gate FinFET 201 includes a silicon fin region 230, a source region 240, and a drain region 260. FinFET 201 also includes gate regions 250 and 251, separated by nitride region 255. In an embodiment, the channel width W is about 5-50 nm, and the channel length L is about 5-30 nm. The widened areas for source, drain, and gates are used for contact formation. Also shown in FIG. 2, tri-gate FinFET 202 includes a silicon fin region 230, a source region 240, and a drain region 260. FinFET 202 also includes a single gate region 250. In a specific embodiment of FinFET 202, the channel width W is about 5-50 nm, and the channel length L is about 5-30 nm.

A method for fabricating an integrated circuit device according to an embodiment of the present invention may be outlined as follows:

1. Provide a silicon on insulator (SOI) substrate and threshold voltage implant;
2. form a silicon nitride film;
3. Pattern the silicon nitride film;
4. Pattern silicon fin regions;
5. Form gate dielectric regions on the sides of the silicon fin regions;
6. Deposit a polysilicon film;
7. Planarize the polysilicon film;
8. Define gate electrodes;

9. Form spacers;
10. Form source and drain regions;
11. Form elevated source and drain regions; and
12. Perform backend process.

The above sequence of steps provides a method for fabricating an integrated circuit including a dual gate FinFET and a tri-gate FinFET according to an embodiment of the present invention. As shown, the method uses a combination of steps including a way of fabricating a dual gate FinFET and a single-gate FinFET on the same SOI substrate. Other alternatives can also be provided where steps are added, one or more steps are removed, or one or more steps are provided in a different sequence without departing from the scope of the claims herein. Further details of the present method can be found throughout the present specification and more particularly below.

Figure 3:
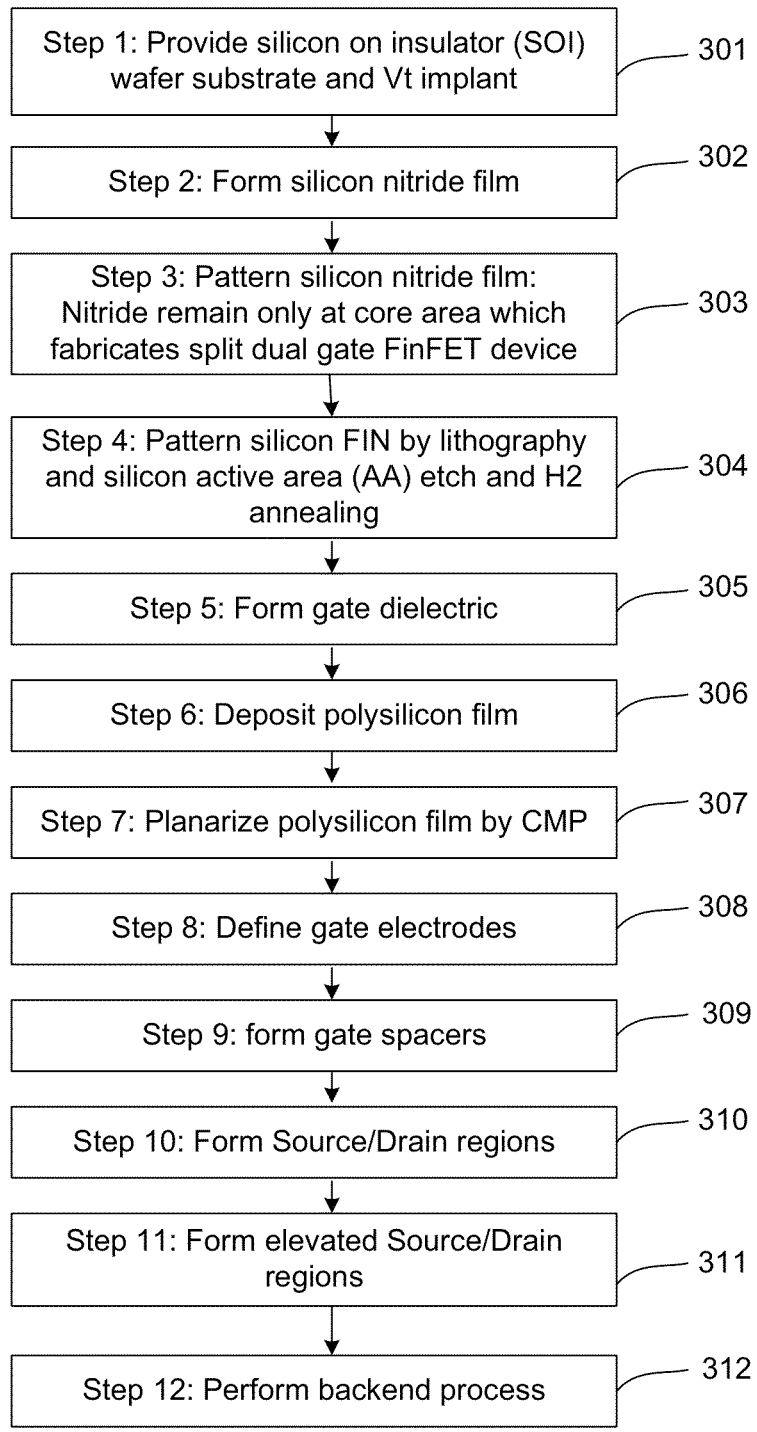
FIG. 3 is a simplified flow chart of a method for making a Dual-gate FinFET device and a Tri-gate FinFET device according to an embodiment of the present invention.

FIG. 3 is a simplified flow chart of a method for making a Dual-gate FinFET device and a Tri-gate FinFET device according to an embodiment of the present invention. This diagram is merely an example, which should not unduly limit the scope of the claims herein. One of ordinary skill in the art would recognize other variations, modifications, and alternatives. The processes in FIG. 3 will be discussed with reference to FIGS. 4-15.

FIGS. 4 to 10 and FIGS. 11A-D, 12A, 12B, 13A, 13B, 14A, 14B, 15A, and 15B are simplified cross-sectional view diagrams of a method for making a Dual-gate FinFET device and a Tri-gate FinFET device according to an embodiment of the present invention. These diagram are merely examples, which should not unduly limit the scope of the claims herein. One of ordinary skill in the art would recognize other variations, modifications, and alternatives. As shown, the method according to an embodiment of the invention starts by providing a silicon on insulator (SOI) substrate (process 301 in FIG. 3).

Figure 4:
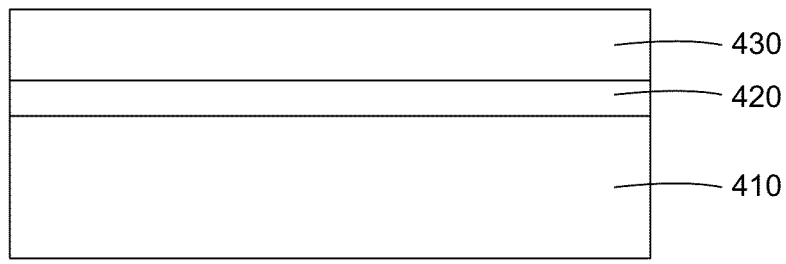
FIGS. 4-10 and FIGS. 11A-D, 12A, 12B, 13A, 13B, 14A, 14B, 15A, and 15B are simplified cross-sectional view diagrams of a method for making a Dual-gate FinFET device and a Tri-gate FinFET device according to an embodiment of the present invention.

FIG. 4 is a simplified cross-sectional view diagram of a method according to an embodiment of the present invention along cross section AA' of FIG. 2. As shown in FIG. 4, the SOI substrate in an embodiment of the invention includes a silicon substrate 410, a silicon dioxide layer 420 overlying the silicon substrate, and a Si layer 430 overlying the silicon dioxide layer. In an alternative embodiment, a SiGe layer 430 can be used. In an embodiment, layer 430 has a thickness range of about 5-100 nm. Process 301 also includes performing threshold adjustment implant (Vt implant). In an embodiment, the channel doping is around $1-5 \times 10^{18}/cm^3$ for an N-type FinFET. In a specific embodiment, threshold adjustment implant is performed using boron containing impurities at a dose of $1-5 \times 10^{12}/cm^2$ and an implantation energy of 1-30 KeV. In some embodiments, a P-type FinFET receives N-type impurities such as arsenic or phosphorus at a dose of $1-5 \times 10^{12}/cm^2$ and implant energy of 1-20 KeV. These implant conditions are merely examples, which should not unduly limit the scope of the claims herein. One of ordinary skill in the art would recognize other variations, modifications, and alternatives.

Figure 5:
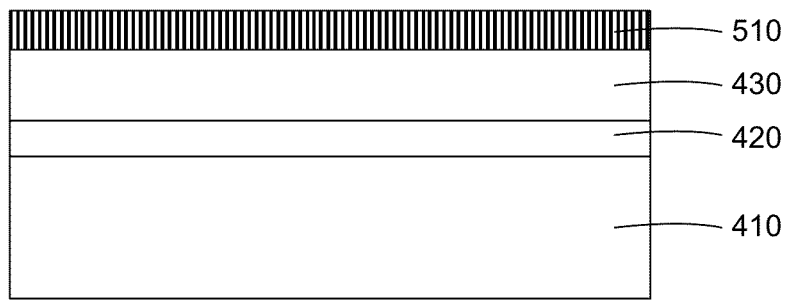

FIG. 5 is a simplified view diagram of a method according to an embodiment of the present invention. As shown in FIG. 5, the method includes (process 302) forming a silicon nitride film 510. In an embodiment, a silicon nitride film is deposited in the SOI substrate at a temperature range of approximately 700-800° C. to a thickness of about 100-500 nm. Of course, there can be other variations, modifications, and alternatives.

Figure 6:
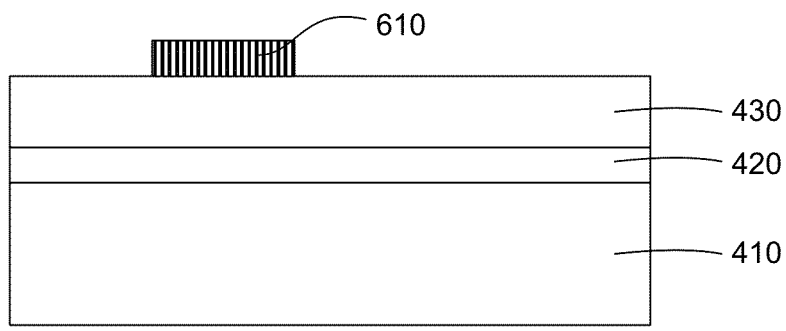

In process 303, the nitride film is patterned as shown in FIG. 6. FIG. 6 is a simplified cross-sectional view diagram of a method according to an embodiment of the present invention. In an embodiment, the SOI substrate includes a first region for core logic devices and a second region for I/O devices. In a specific embodiment, dual-gate FinFETs are provided in a core logic region, and tri-gate FinFETs are provided in an I/O circuit region. In process 303, the nitride film is removed from the single-gate FinFET device area. In contrast, patterned nitride film is maintained in a portion of the dual-gate FinFET device area. Of course, there can be other variations, modifications, and alternatives.

Figure 7:
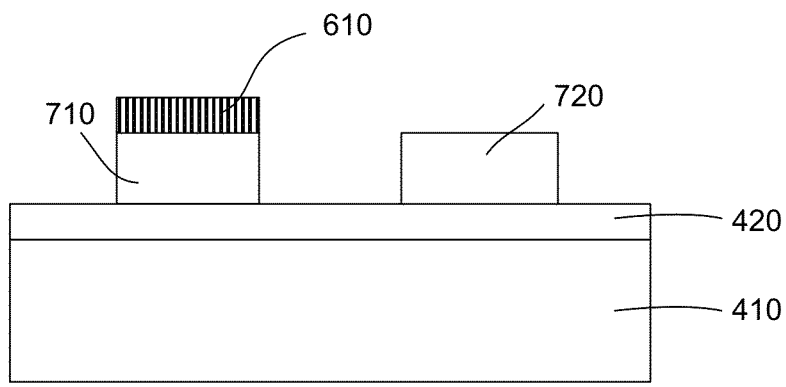

In process 304, silicon fin regions are defined. Here, silicon film layer 430 is etched using a photo resist mask. In a specific embodiment, conventional reactive ion etching (RIE) process is used to etch the silicon film. FIG. 7 is a simplified cross-sectional view diagram of a method according to an embodiment of the present invention. FIG. 7 shows a silicon fin region 710 under nitride layer 610 for a dual-gate FinFET device. Also shown is a silicon fin region 720 of a single-gate FinFET device. The silicon fin regions are then annealed in an $H_2$ ambient at a temperature ranging from about 800° C. to about 1000° C. The silicon fin regions defined in process 304 are used as FET active areas, including source, channel, and drain regions, as will be discussed below. Of course, there can be other variations, modifications, and alternatives.

Figure 8:
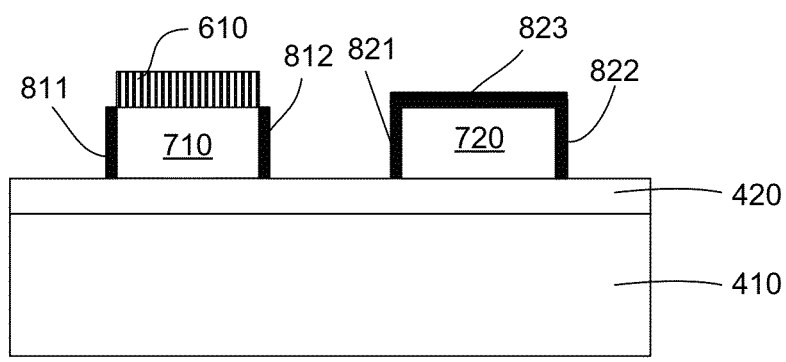

FIG. 8 is a simplified cross-sectional view diagram of a method according to an embodiment of the present invention. In an embodiment of the invention, the method includes providing a gate dielectric (process 305). As shown in FIG. 8, gate dielectric regions 811 and 812 are formed on the sides of silicon fin region 710 in the dual-gate FinFET region. A gate dielectric is formed on the surfaces of silicon fin region 720 in the single-gate FinFET region, identified as 821, 822, and 823. In an embodiment, process 305 includes the following steps:

1. Base oxide grow with in situ steam-generated (ISSG) or rapid thermal oxidation (RTO) at a temperature range of about 700° C. to 900° C. to a thickness of about 0.1-3 nm;
2. Decoupled Plasma nitridation (DPN) in a nitrogen ambient; and
3. Post nitridation anneal (PNA).

Of course, there can be other variations, modifications, and alternatives.

Figure 9:
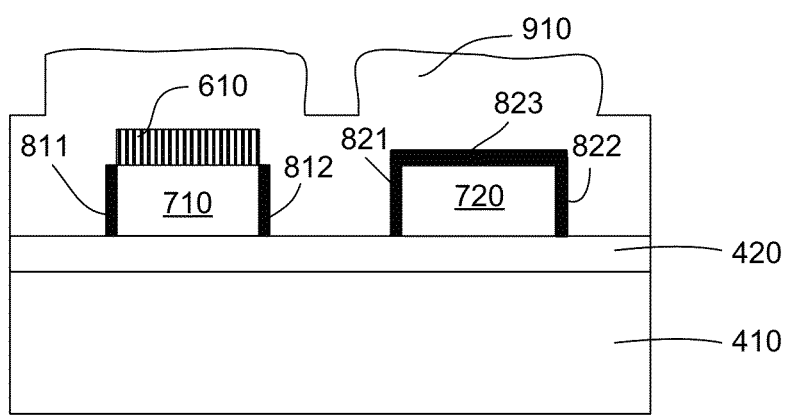

FIG. 9 is a simplified cross-sectional view diagram of a method according to an embodiment of the present invention. In an embodiment, process 306 deposits a polysilicon film 910 (in FIG. 9) in a temperature range of approximately 600° C. to 800° C. and a thickness range of about 100-500 nm. In a specific embodiment, the polysilicon film is doped in-situ with N-type impurities such as phosphorus.

Figure 10:
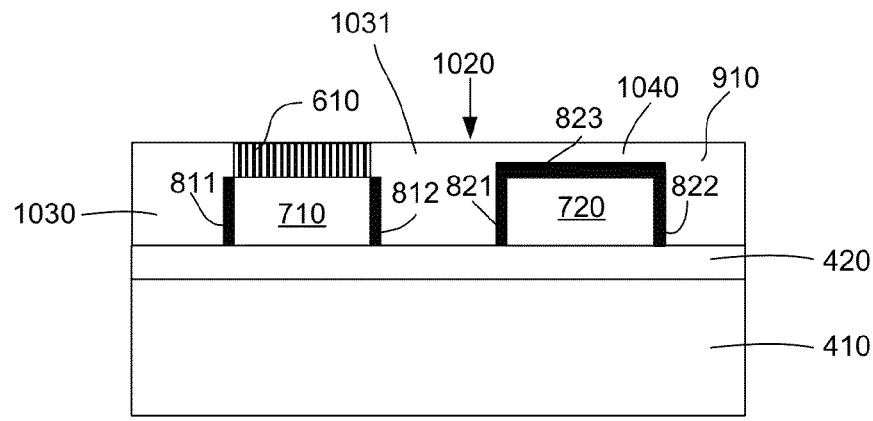

FIG. 10 is a simplified cross-sectional view diagram of a method according to an embodiment of the present invention. As shown, polysilicon film 910 is planarized in process 307 by chemical mechanical polish (CMP) using nitride film 610 as polish stop. As shown in FIG. 10, after CMP, the polysilicon film 910 has a surface 1020. The polysilicon film is also divided into regions 1030 and 1031 which are separated by nitride film 610 that is formed above the silicon fin region 710. On the other hand, polysilicon film 910 is continuous over silicon fin region 720. A portion of polysilicon 1040 overlaps gate dielectric 823 and silicon fin 720.

Figure 11A:
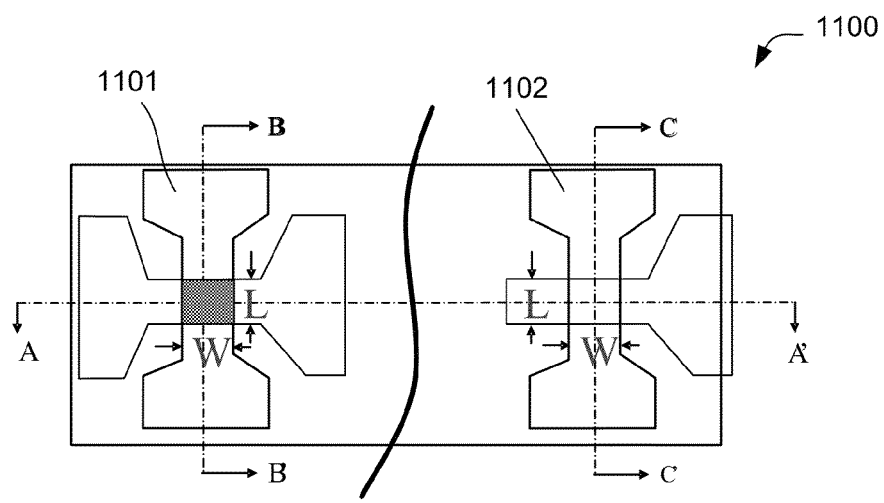
Figure 11B:
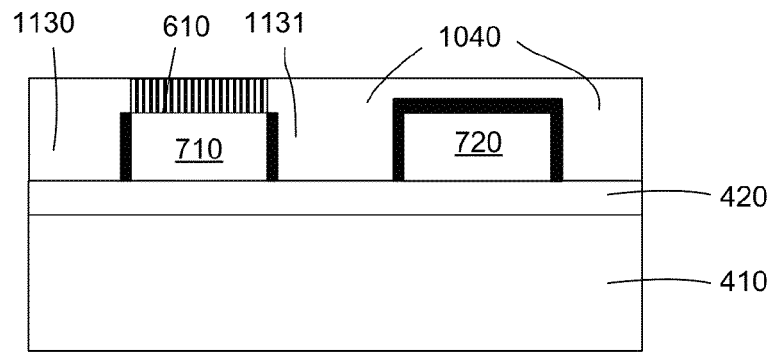
Figure 11C:
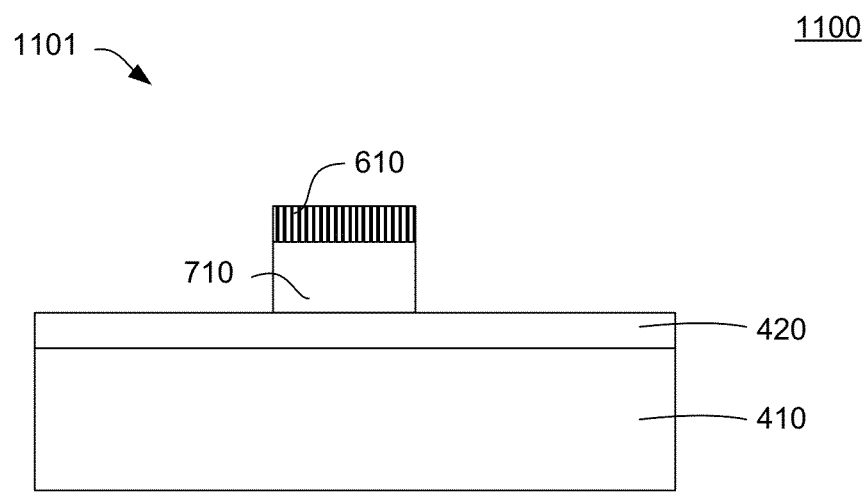
Figure 11D:
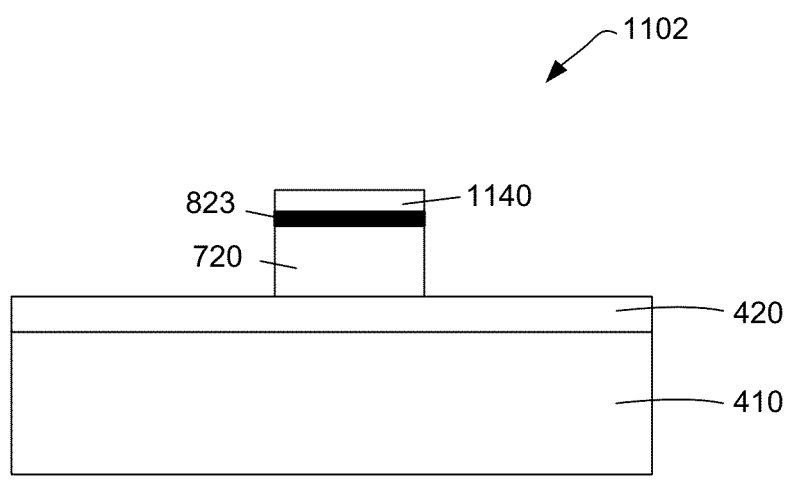

In process 308, the gate electrodes are patterned. First a hard mask is deposited and patterned over the structures on the substrate. In an embodiment, the hard mask is a dielectric material such as silicon dioxide or silicon nitride. The polysilicon is then etched using conventional RIE techniques. Afterwards, the hard mask is stripped. FIG. 11A, similar to FIG. 2, is a simplified top view layout diagram according to an embodiment of the invention. FIG. 11A includes dashed line marked AA' which extends through the gate electrode patterns of a dual-gate FinFET 1101 on the left and a tri-gate FinFET 1102 on the right. FIG. 11A also includes dashed lines BB' extending through the silicon fin region of a dual-gate FinFET 1101 on the left and dashed CC' extending through the silicon fin region of a tri-gate FinFET 1102 on the right. FIG. 11B is a simplified cross-sectional view along the AA' direction. As shown, the polysilicon film has been etched into two parts. In the dual-gate FinFET region on the left, the polysilicon film includes two parts, 1130 and 1131 that are separated by nitride film 610. In the single-gate FinFET region on the right, polysilicon film 1140 extends to both sides of silicon fin region. FIG. 11C is a simplified cross-sectional view diagram of dual-gate FinFET 1101 along the BB' direction of FIG. 11A. As shown, nitride film 610 is positioned over the silicon fin region 710. FIG. 11D is a simplified cross-sectional view diagram of tri-gate FinFET 1102 along the CC' direction of FIG. 11A. As shown, polysilicon film 1040 is positioned over gate dielectric layer 823 which is over the silicon fin region 720. Of course, there can be other variations, modifications, and alternatives.

Figure 12A:
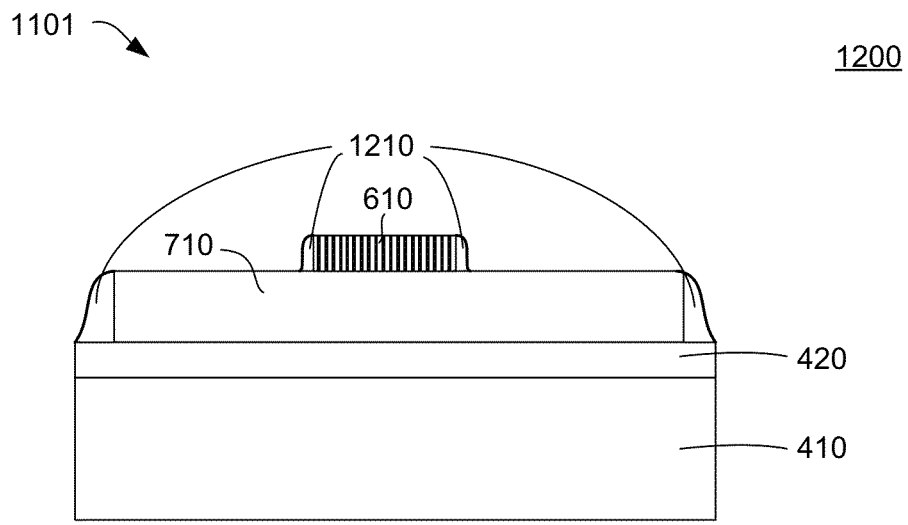
Figure 12B:
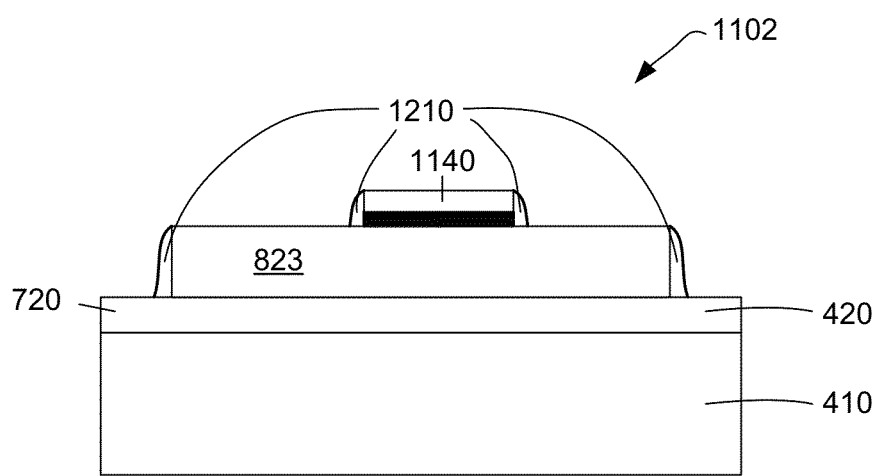

FIG. 12A is a simplified cross-sectional view diagram of dual-gate FinFET 1101 along the BB' direction of FIG. 11A according to an embodiment of the invention. FIG. 12B is a simplified cross-sectional view diagram of tri-gate FinFET 1102 along the CC' direction of FIG. 11A according to an embodiment of the invention. In an embodiment, the method of forming dual-gate and tri-gate FinFETs includes forming ONO (oxide-nitride-oxide) spacers (Process 309). The method first performs gate nitridation, followed by an high temperature oxidation (HTO) offset process. The method then forms a nitride spacer. The method also includes forming HTO layer and RIE etching to form spacers 1210 as shown in FIGS. 12A and 12B. Of course, there can be other variations, modifications, and alternatives.

Figure 13A:
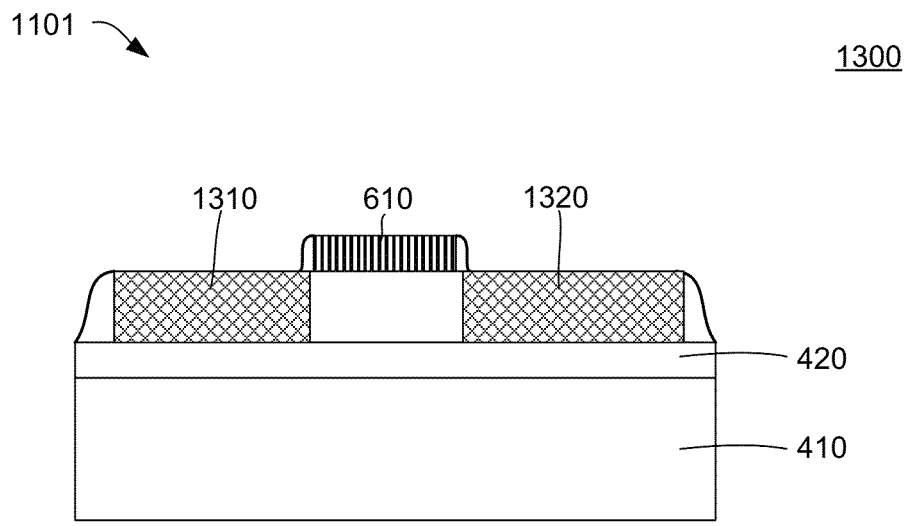
Figure 13B:
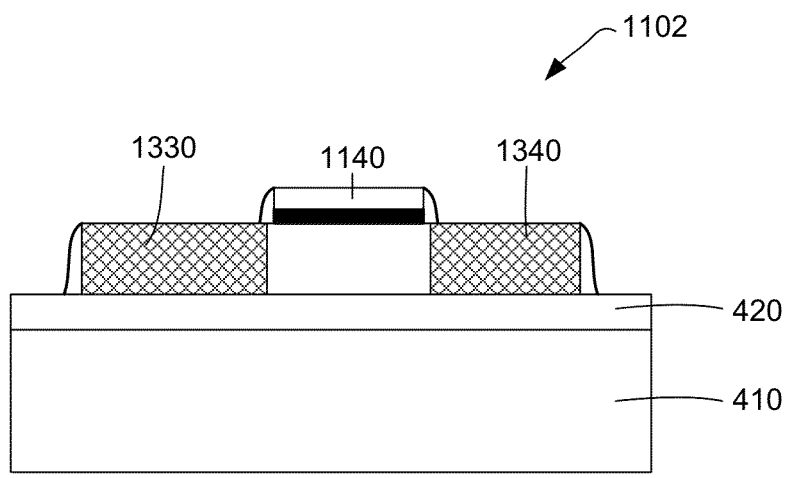

The method also includes (process 310) implanting impurities to form source regions 1310 and 1330, and drain regions 1320 and 1340 as shown in FIGS. 13A and 13B. FIG. 13A is a simplified cross-sectional view diagram of dual-gate FinFET 1101 along the BB' direction of FIG. 11A according to an embodiment of the invention. FIG. 13B is a simplified cross-sectional view diagram of tri-gate FinFET 1102 along the CC' direction of FIG. 11A according to an embodiment of the invention. For N-type FinFET, the source/drain implantation includes, for example, N-type impurities such as As, at a dose of about $1-5\times10^{15}/cm^2$ and an energy of less than 1.0 KeV. In specific embodiments, tilt angles of 1°-30° degrees are used. For P-type FinFET, source/drain implantation includes P-type impurities such as boron at a dose of about $1-5\times10^{15}/cm^2$, and an energy of less than 1.0 KeV. In specific embodiments, tilt angles of 1°-30° degrees are used. The method also includes performing spike anneal at a temperature range of about 1000-1100 degrees Celsius. Of course, there can be other variations, modifications, and alternatives.

Figure 14A:
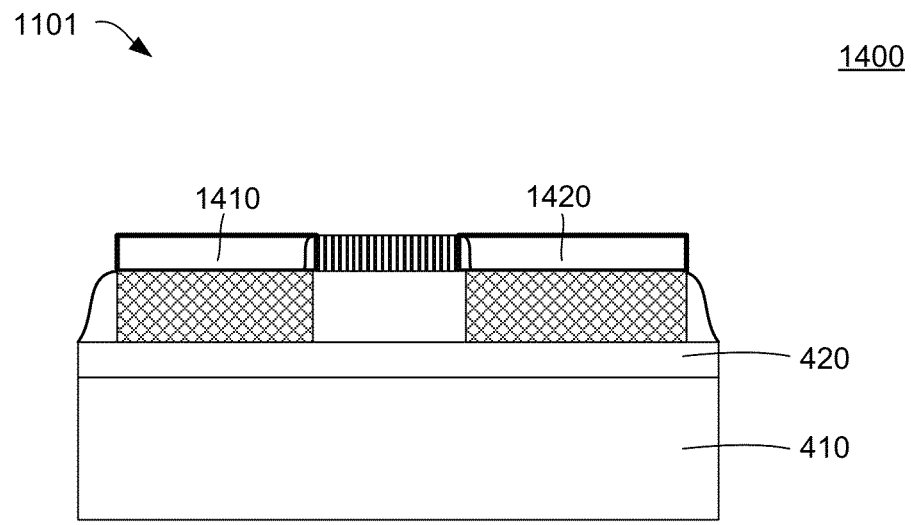
Figure 14B:
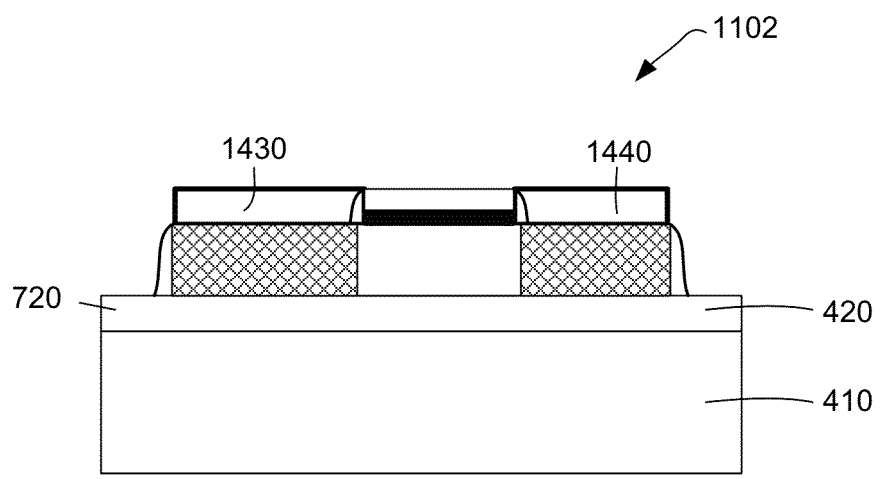

In specific embodiments, the method forms elevated source/drain structures 1410, 1420, 1430, and 1440 as shown in FIGS. 14A and 14B. FIG. 14A is a simplified cross-sectional view diagram of dual-gate FinFET 1101 along the BB' direction of FIG. 11A according to an embodiment of the invention. FIG. 14B is a simplified cross-sectional view diagram of tri-gate FinFET 1102 along the CC' direction of FIG. 11A according to an embodiment of the invention. Process 311 includes Selective Epitaxial Growth (SEG) of SiGe at a temperature range of about 700-800° C., in an ambient of $SiH_2Cl_2+HCl+GeH_4$. In some embodiments, the SiGe layer may have a thickness of about 100-500 nm and Ge content of about 10-30%. In certain embodiment, the SiGe layer is also doped with boron concentration about $1-5\times10^{20}$ cm$^{-3}$. Of course, there can be other variations, modifications, and alternatives.

Figure 15A:
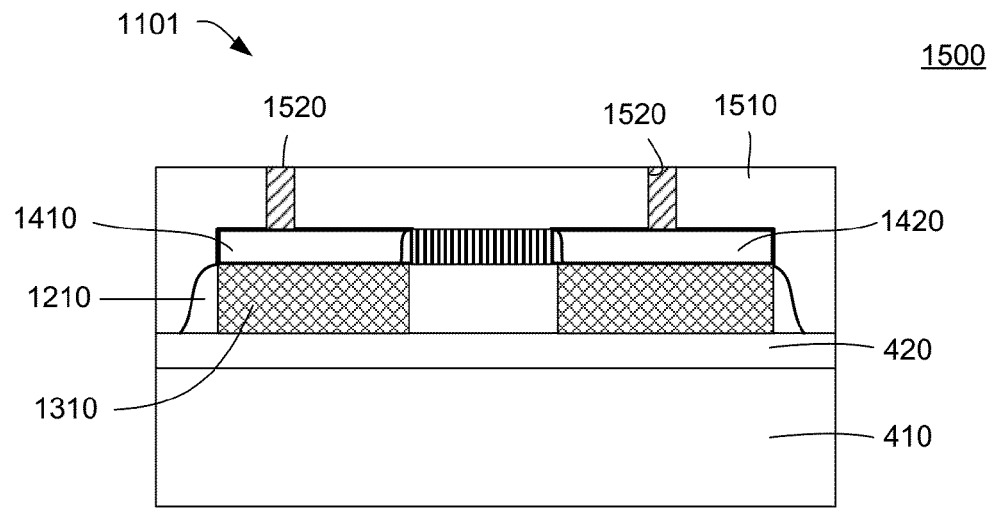
Figure 15B:
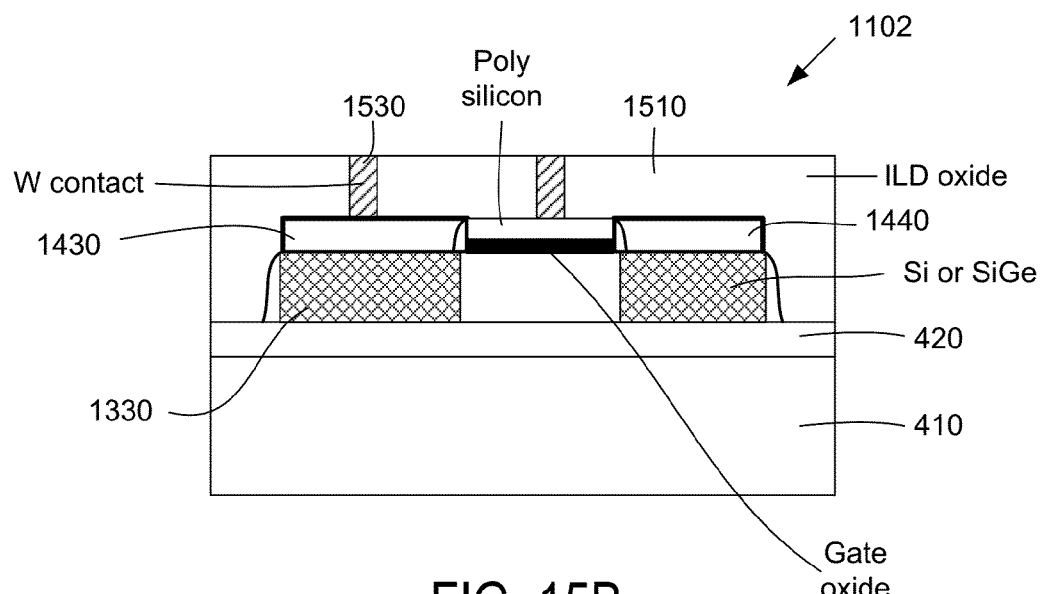

In some embodiments of the present invention, the method also includes performing backend processing. As shown in FIGS. 15A and 15B, process 312 includes forming interlayer dielectric (ILD) 1510 and contact structures such as 1520 and 1530. FIG. 15a is a simplified cross-sectional view diagram of dual-gate FinFET 1101 along the BB' direction of FIG. 11A according to an embodiment of the invention. FIG. 15B is a simplified cross-sectional view diagram of tri-gate FinFET 1102 along the CC' direction of FIG. 11a according to an embodiment of the invention. In some embodiments, the contact structures are tungsten plugs. Process 312 also includes forming interconnects using copper and low k dielectrics. In preferred embodiments, single-gate FinFETs and dual-gate FinFETs are formed on the same chip.

Figure 16:
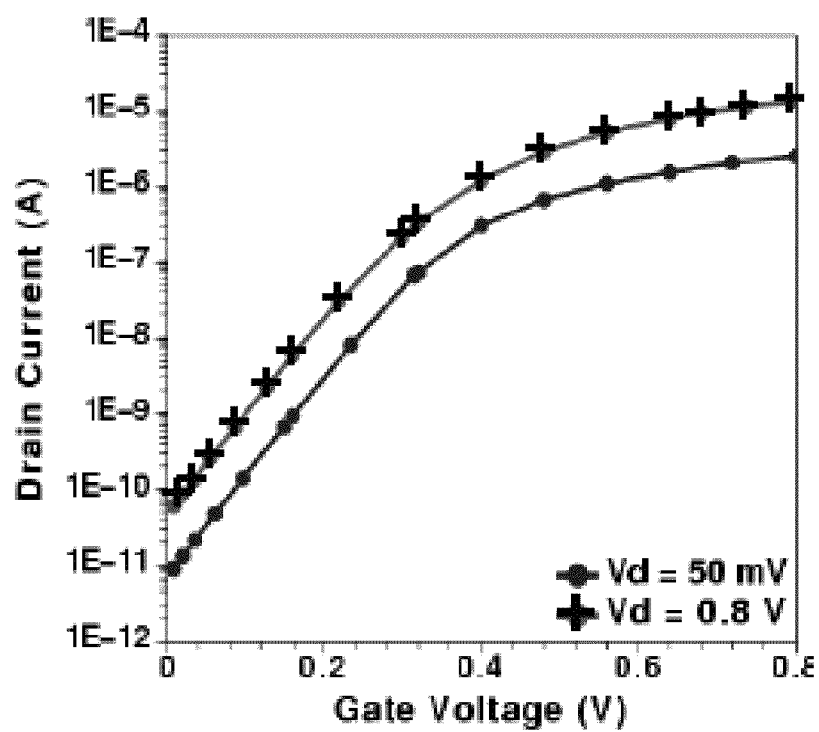
FIG. 16 is a simplified diagram of current voltage curves of a Tri-gate FinFET according to an embodiment of the present invention.

FIG. 16 is a simplified diagram of simulated current voltage curves of a single-gate (Tri-gate) FinFET device according to an embodiment of the present invention. This diagram is merely an example, which should not unduly limit the scope of the claims herein. One of ordinary skill in the art would recognize other variations, modifications, and alternatives. As shown, the simulated drain current of a 30 nm Tri-gate FinFET device is plotted against gate voltage for drain biases of 0.8 V and 50 mV, respectively. FIG. 16 is merely an example. Of course, one skilled in the art will recognize other variations, modifications, and alternatives.

A method for operating an integrated circuit device according to an embodiment of the present invention may be outlined as follows:

1. providing an SOI substrate;
2. providing a first circuit region in the SOI substrate;
3. providing a second circuit region in the SOI substrate;
4. adding a tri-gate FinFET in the first circuit region, the tri-gate FinFET comprising a drain electrode, a source electrode, and a gate electrode;
5. adding a dual-gate FinFET in the second circuit region, the dual-gate FinFET comprising a drain electrode, a source electrode, and a first gate electrode a second gate electrode;
6. applying a first bias voltage and second bias voltage to the drain electrode and the source electrode of the tri-gate FinFET, respectively;
7. receiving a first signal at the gate electrode of the tri-gate FinFET;
8. applying a third bias voltage and fourth bias voltage to the drain electrode and the source electrode of the dual-gate FinFET, respectively; and
9. receiving a second signal and a third signal at the first gate electrode and the second gate electrode of the tri-gate FinFET, respectively.

In a specific embodiment, the tri-gate FinFET includes a channel region that is surrounded by the gate electrode on three sides. The dual-gate FinFET includes a channel region sandwiched between the first and second gate electrodes. In some embodiments, the first circuit region is an I/O region. In certain embodiments, the second circuit region is a core logic region. In a specific embodiment, the third signal is a dynamic signal generated by another circuit. In some embodiments, the dual-gate FinFET is configured to be operated in a weak inversion region. Of course, there can be other variations, modifications, and alternatives.

The above sequence of processes provides a method for operating an integrated circuit including a dual-gate FinFET and a tri-gate FinFET according to an embodiment of the present invention. As shown, the method uses a combination of steps including a way of operating a dual gate FinFET and a single-gate FinFET on the same SOI substrate. For example, in some embodiments, an integrated circuit chip includes single-gate FinFETs in I/O circuits and dual-gate FinFETs in core logic circuits. Of course, there can be other variations, modifications, and alternatives. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making an integrated circuit including at least a tri-gate FinFET region and a dual-gate FinFET region, the method comprising:
    providing a semiconductor on insulator (SOI) substrate, the SOI substrate comprising a semiconductor layer overlying an insulator layer, the semiconductor layer having a surface region, the surface region including the tri-gate FinFET region and the dual-gate FinFET region;
    implanting impurities into the semiconductor layer for a threshold voltage adjustment;
    forming a silicon nitride film overlying the surface region;
    forming a nitride cap region in the dual-gate FinFET region and completely removing the silicon nitride film in the tri-gate FinFET region in a same etching process step;
    etching the semiconductor layer to form a first silicon fin region in the dual-gate FinFET region and a second silicon fin region in the tri-gate FinFET region that is free of the silicon nitride film, the nitride cap region being maintained on a portion of a surface region of the first silicon fin region;
    forming a gate dielectric;
    depositing a polysilicon film;
    planarizing the polysilicon film by chemical mechanical polishing (CMP) using the nitride cap region as a polish stop;
    selectively etching the polysilicon film to form a first and a second gate electrodes of the first silicon fin region covered by the nitride cap, the first and a second gate electrodes being on opposite sides of the first silicon fin region;
    selectively etching the polysilicon film to form a third gate electrode, the third gate electrode being adjacent to and overlying a portion of the second silicon fin region;
    forming spacers;
    implanting impurities to form source and drain regions;
    forming elevated source and drain regions; and
    performing backend processing.

2. The method of claim 1, wherein the SOI substrate comprising a substrate, an oxide layer overlying the substrate, and a silicon layer overlying the oxide layer, the silicon layer including the surface region.

3. The method of claim 1, wherein the SOI substrate comprising a substrate, an insulator layer overlying a substrate, and a silicon-germanium layer overlying the insulator layer, the silicon-germanium layer including the surface region.

4. The method of claim 1, wherein the first silicon fin region is characterized by a width of about 5-50 nm and a height of about 5-100 nm.

5. The method of claim 1, wherein the second silicon fin region is characterized by a width of about 5-50 nm and a height of about 5-100 nm.

6. The method of claim 1, wherein forming a first and a second silicon fin regions further comprising annealing in an $H_2$ ambient at a temperature range of approximately 800-1000° C.

7. The method of claim 1, wherein selectively etching the polysilicon film further comprises:
    providing a hard mask;
    patterning the hard mask;
    etching the polysilicon film; and
    removing the hard mask.

8. The method of claim 1, wherein forming elevated source and drain regions further comprises:
    forming a SiGe layer on the source and drain regions by selective epitaxial growth at a temperature of about 700-800° C. in an ambient of $SiH_2Cl_2+HCl+GeH_4$.

9. The method of claim 8, wherein the SiGe layer comprises a thickness of about 100 nm to about 500 nm and a Ge content of about 10-30%.

10. The method of claim 1, wherein performing backend process further comprises:
    depositing interlayer dielectrics, the dielectrics comprising low-k dielectrics;
    forming contact regions, the contact regions comprising tungsten plugs; and
    forming interconnect, the interconnect comprising copper interconnect lines.

11. The method of claim 1, wherein depositing a polysilicon film is conducted at a temperature in a range of about 600 degrees C. to 800 degrees C.

12. The method of claim 1, wherein the deposited polysilicon film has a thickness in a range of about 100 nm to about 500 nm.

13. The method of claim 1, wherein implanting impurities comprises doping at a dose of 1 to $5\times10^{12}/cm^2$ and an implant energy of 1 to 30 KeV.

14. The method of claim 1, wherein forming a silicon nitride film comprises depositing the silicon nitride film at a temperature of about 700 degrees C. to 800 degrees C. and with a thickness in a range of about 100 nm to about 500 nm.

15. A method for making an integrated circuit including at least a tri-gate FinFET and a dual-gate FinFET, the method comprising:
    providing a semiconductor on insulator (SOI) substrate, the SOI substrate comprising a semiconductor layer overlying an insulator layer, the semiconductor layer having a first region and a second region;
    forming a silicon nitride film overlying the surface region;
    forming a nitride cap in the first region and completely removing the silicon nitride film in the second region in a same etching step;
    etching the semiconductor layer to form a first silicon fin region having a portion below the nitride cap in the first region and a second silicon fin region in the second region that is free of the silicon nitride film;
    forming a gate dielectric layer;
    depositing a polysilicon film;
    planarizing the polysilicon film by chemical mechanical polishing (CMP) using the nitride cap region as a polish stop; and
    selectively etching the polysilicon film to form a first gate electrode and a second gate electrode of the first silicon fin region covered by the nitride cap, and a third gate electrode of the second fin region;
    wherein the first and second gate electrodes are on opposite sides of the first silicon fin region, and
    wherein the third gate electrode is adjacent to and overlying a portion of the second silicon fin region.

16. The method of claim 15, wherein the first region is a core logic region and the second region is in an input/output (I/O) region.

17. The method of claim 15, further comprising annealing the first and second silicon fin regions in an $H_2$ ambient at a temperature ranging from about 800 degrees C. to about 1000 degrees C.

18. The method of claim 15, wherein forming the gate dielectric layer comprises:
rapid thermal oxidation at a temperature in a range of about 700 degrees C. to about 900 degrees C. with a thickness in a range of about 0.1 nm to about 3 nm;
decoupled plasma nitridation in a nitrogen ambient; and
post nitridation anneal.

* * * * *